(12) United States Patent
Yano et al.

(10) Patent No.: US 7,446,575 B2
(45) Date of Patent: *Nov. 4, 2008

(54) CAPACITOR CHARGING METHODS AND APPARATUSES THAT USE A SECURE PARALLEL MONITORING CIRCUIT

(75) Inventors: Kohichi Yano, Kanagawa-ken (JP); Akihiko Fujiwara, Kanagawa-ken (JP)

(73) Assignee: Ricoh Company, Ltd., Tokyo (JP)

( * ) Notice: Subject to any disclaimer, the term of this patent is extended or adjusted under 35 U.S.C. 154(b) by 216 days.

This patent is subject to a terminal disclaimer.

(21) Appl. No.: 11/357,339

(22) Filed: Feb. 21, 2006

(65) Prior Publication Data

US 2006/0139063 A1 Jun. 29, 2006

Related U.S. Application Data

(63) Continuation of application No. 10/840,641, filed on May 7, 2004, now Pat. No. 7,034,580.

(30) Foreign Application Priority Data

May 9, 2003 (JP) ............................. 2003-131062

(51) Int. Cl.
*H03K 5/153* (2006.01)
*H01M 10/44* (2006.01)
*H01M 10/46* (2006.01)

(52) U.S. Cl. ..................... 327/74; 327/75; 320/121; 320/122

(58) Field of Classification Search ................ None
See application file for complete search history.

(56) References Cited

U.S. PATENT DOCUMENTS

| | | |
|---|---|---|
| 4,238,721 A | 12/1980 | DeLuca et al. |
| 5,677,613 A | 10/1997 | Perelle |
| 5,932,990 A | 8/1999 | Kaneko |
| 5,936,384 A | 8/1999 | Fujiwara et al. |
| 5,969,505 A | 10/1999 | Okamura |
| 6,075,378 A | 6/2000 | Okamura |
| 6,121,752 A | 9/2000 | Kitahara et al. |
| 6,144,248 A | 11/2000 | Oosugi et al. |
| 6,225,781 B1 | 5/2001 | Okamura et al. |
| 6,316,915 B1 | 11/2001 | Fujiwara et al. |
| 6,501,248 B2 | 12/2002 | Fujiwara |

(Continued)

FOREIGN PATENT DOCUMENTS

JP A-8-237861 9/1996

*Primary Examiner*—Tuan T Lam
(74) *Attorney, Agent, or Firm*—Dickstein Shapiro LLP

(57) ABSTRACT

A capacitor charging circuit and method including a plurality of serially connected capacitors and parallel monitor circuits connected in parallel on a one-to-one basis to the capacitors. Each one of parallel monitor circuits applies a direct-current source voltage to a capacitor and bypasses a charge current of the capacitor when the charge voltage of the capacitor exceeds a reference voltage. Each of the parallel monitor circuits includes a reference voltage circuit, a voltage detecting circuit, a comparator, a bypass switching circuit, and a voltage limiter. The reference voltage circuit generates the reference voltage. The voltage detecting circuit detects the charge voltage of the capacitor. The comparator compares the reference voltage with an output voltage from the voltage detecting circuit and controls the bypass switching circuit to bypass the charge voltage using the voltage limiter to limit a voltage applied to the bypass switching circuit.

5 Claims, 4 Drawing Sheets

U.S. PATENT DOCUMENTS 6,563,292 B2 5/2003 Fujiwara
7,227,407 B2 * 6/2007 Yano et al. .................. 327/565

2003/0214267 A1 11/2003 Long
2004/0036446 A1 2/2004 Iwashima

* cited by examiner

US 7,446,575 B2

CAPACITOR CHARGING METHODS AND APPARATUSES THAT USE A SECURE PARALLEL MONITORING CIRCUIT

This patent application is a continuation application of U.S. patent application Ser. No. 10/840,641, filed on May 7, 2004 now U.S. Pat. No. 7,034,580, which claims priority from Japanese patent application, no. JPAP2003-131062, filed on May 9, 2004 in the Japan Patent Office, the entire contents of each of which are incorporated by reference herein.

FIELD OF THE INVENTION

The present invention relates to capacitor charging methods and apparatuses, and more particularly to capacitor charging methods and apparatuses in which a parallel monitoring circuit is provided with a voltage limiter for protecting a bypass switching element.

BACKGROUND OF THE INVENTION

An electric double-layer capacitor can perform an extremely quick charging in comparison with a storage battery and yet has a storage capacity advantage over the storage battery. The electric double-layer capacitor, however, has a relatively low voltage rating such as a value on the order of 3 volts and therefore, a plurality of electric double-layer capacitors are commonly connected in series in order to generate a desirable voltage.

In charging the capacitors with relatively large capacities, connected in series as described above, there are issues concerning the differences in capacity among the capacitors and an unevenness of charges varied by self-charging and self-discharging. To overcome these issues, a circuit for uniformalizing the charging is commonly used. Such circuit may be referred to as a parallel monitor circuit.

Referring to FIG. 1, a parallel monitor circuit is now explained. As illustrated in FIG. 1, capacitors C1 and C2 are connected in series and are provided with a parallel monitor circuit. For example, the capacitor C1 is provided with a parallel monitor circuit which includes a reference voltage Vr1, a comparator CMP1, a bypass switching element Tr1, and a zener diode D1. The capacitor C2 is provided with another parallel monitor circuit which includes a reference voltage Vr2, a comparator CMP2, a bypass switching element Tr2, and a zener diode D2.

The capacitor C1 is charged by a direct current power source (not shown) and, as the charge is increased, a voltage of the capacitor C1 is increased. When the voltage of the capacitor C1 exceeds the reference voltage Vr1, the comparator CMP1 outputs a high voltage which turns on the bypass switching element Tr1. As a result, a charge current of the capacitor C1 is allowed to flow through the bypass switching element Tr1 and consequently the voltage of the capacitor C1 is clamped at the same voltage as the reference voltage Vr1.

The above-described operation is performed by each one of the capacitors connected in series. This may prevent deterioration and/or damage of the capacitors due to uneven charging. If the capacitor is rapidly charged to a high voltage, the zener diode D1 may be damaged and a relatively large current may flow through the zener diode D1.

The above-described operation is needed to control a plurality of reference voltages predetermined per each capacitor and changes them in accordance with the use conditions. However, it may be difficult to control and change each of the reference voltages for the capacitors when using a huge number of capacitors such as an electric automobile, an electric power reserve system, etc.

In one attempt for the above circuit, an operational voltage is controlled by applying a voltage setting signal to a plurality of the capacitors from a common signal source through a joint circuit. With this structure, a remote control can be carried out in a simple structure.

To charge a large number of capacitors using this circuit structure, the number of parallel monitor circuits is increased and accordingly a space shared by the circuit increases, resulting in a high manufacturing cost.

Integration of the parallel monitor circuits involves various issues. When the power source for the comparator is supplied from the terminal voltage of the corresponding capacitor, as shown in FIG. 1, an isolated area for forming each comparator circuit is needed on the semiconductor substrate.

There are three isolation methods to isolate each of the comparators on the semiconductor substrate; a PN junction method; a method using an isolation material; and a beam lead method. The PN junction method uses a characteristic that a PN junction applied with a reverse bias has an isolation region. The PN junction method has drawbacks of a relatively low resistance to pressure, a relatively large stray capacitance in the circuit, and a high frequency signal due to its large capacity. One example of using an isolation material implants a silicon oxide layer to a silicon substrate. The beam lead method dissolves the substrate between the elements by way of a chemical method to isolate the elements. Among these three methods, the second and third methods require a huge cost.

In using the first method having an N-type semiconductor substrate, an issue is a formation of an independent isolation region (i.e., Pwell region) which is needed to be formed for each of a plurality of comparators. In the same way, when the first method uses a P-type semiconductor substrate, an isolation region (i.e., an Nwell region) is needed to be formed, resulting in a large chip area which also causes a problem of a high manufacturing cost.

Further, if the source power for the comparators is supplied from a direct-current power source which charges the serially-connected capacitors, the necessity for forming the isolation region (i.e., the Pwell or the Nwell) for each comparator is eliminated and therefore the chip area can be made smaller. However, in this case, an amplitude of the output voltage from the comparator expands approximately to that of the source power voltage, resulting in damage to a bypass switching element used therein.

SUMMARY OF THE INVENTION

The present invention provides a capacitor charging technique in which a bypass switching element is arranged to bypass a charge current of a capacitor when the charge voltage exceeds a predetermined reference voltage.

In one exemplary embodiment, a novel capacitor charging circuit includes a direct-current power source, a plurality of capacitors and a plurality of parallel monitor circuits. The direct-current power source generates a direct-current source voltage. The plurality of capacitors is serially connected one to another. The plurality of parallel monitor circuits is connected in parallel to the plurality of capacitors on a one-to-one basis. Each one of the plurality of parallel monitor circuits applies a direct-current source voltage from the direct-current power source to a corresponding one of the plurality of capacitors and bypasses a charge current of the corresponding one of the plurality of capacitors when a charge voltage of the corresponding one of the plurality of capacitors exceeds a predetermined reference voltage so that the plurality of capacitors are evenly charged. Each of the plurality of parallel monitor circuits includes a reference voltage circuit, a voltage detecting circuit, a comparator, a bypass switching circuit, and a voltage limiter. The reference voltage circuit is configured to generate a predetermined reference voltage. The voltage detecting circuit is configured to detect a charge voltage of the corresponding one of the plurality of capacitors. The comparator compares the predetermined reference voltage with an output voltage from the voltage detecting circuit and is supplied with the direct-current source voltage from the direct-current power source. The bypass switching circuit is configured to bypass the charge voltage under control in accordance with an output from the comparator. The voltage limiter is connected between the comparator and the bypass switching circuit and is configured to limit an applied voltage to the bypass switching circuit.

The voltage limiter may receive the output voltage from the comparator and output a voltage approximately within the charge voltage of the corresponding one of the plurality of capacitors.

The reference voltage circuit, the voltage detecting circuit, the comparator, and the voltage limiter may be integrated into a single integrated circuit.

The direct-current power source may supply the direct-current source voltage to the integrated circuit as well as to the plurality of capacitors.

The voltage limiter may include an N-channel field-effect transistor having a gate connected to the output from the comparator, a source connected to a negative side of the direct-current source voltage, and a drain connected to a positive side of the direct-current source voltage through a resistor.

The voltage limiter may include a P-channel field-effect transistor having a gate connected to the output from the comparator, a drain connected to a negative side of the direct-current source voltage through a resistor, and a source connected to a positive side of the direct-current source voltage.

The bypass switching circuit may be protected from damage by limiting a voltage range across the terminals of the bypass switching circuit within a predetermined voltage of the corresponding one of the plurality of capacitors when the comparator changes the output voltage to limit the direct-current source voltage.

In one exemplary embodiment, a novel capacitor charging circuit includes a direct-current power source, a plurality of capacitor units, and a plurality of integrated circuits. The plurality of capacitor units are serially connected to one another. Each one of the plurality of capacitor units includes a plurality of capacitors serially connected to one another. The plurality of integrated circuits is serially connected to one another. Each one of the plurality of integrated circuits includes parallel monitor circuits connected in parallel to the plurality of capacitors of a corresponding one of the plurality of capacitor units on a one-to-one basis. Each one of the plurality of parallel monitor circuits of a corresponding one of the plurality of integrated circuits applies a direct-current source voltage from the direct-current power source to a corresponding one of the plurality of capacitors of the corresponding one of the plurality of capacitor units. Also, each one of the plurality of parallel monitor circuits of a corresponding one of the plurality of integrated circuits bypasses a charge current of the corresponding one of the plurality of capacitors of the corresponding one of the plurality of capacitor units when a charge voltage of the corresponding one of the plurality of capacitors of the corresponding one of the plurality of capacitor units exceeds a predetermined reference voltage so that capacitors included in the plurality of capacitor units are evenly charged.

In the above-mentioned capacitor charging circuit, each of the plurality of parallel monitor circuits of the corresponding one of the plurality of integrated circuits may include a reference voltage circuit, a voltage detecting circuit, a comparator, a bypass switching circuit, and a voltage limiter. The reference voltage circuit is configured to generate the predetermined reference voltage. The voltage detecting circuit is configured to detect the charge voltage of the corresponding one of the plurality of capacitors. The comparator compares the predetermined reference voltage with an output voltage from the voltage detecting circuit and is supplied with the direct-current source voltage from the direct-current power source. The bypass switching circuit is configured to bypass the charge voltage using an output from the comparator. The voltage limiter is connected between the comparator and the bypass switching circuit and is configured to limit a voltage applied to the bypass switching circuit.

In one exemplary embodiment, a novel semiconductor apparatus includes a plurality of parallel monitor circuits which are connected in parallel to a plurality of external capacitors on a one-to-one basis. Each one of the plurality of parallel monitor circuits applies a direct-current source voltage from the direct-current power source to a corresponding one of the plurality of external capacitors and bypasses a charge current of the corresponding one of the plurality of external capacitors when a charge voltage of the corresponding one of the plurality of external capacitors exceeds a predetermined reference voltage so that the plurality of external capacitors are evenly charged.

In the above-mentioned semiconductor apparatus, each of the plurality of parallel monitor circuits may include a reference voltage circuit, a voltage detecting circuit, a comparator and a voltage limiter. The reference voltage circuit is configured to generate the predetermined reference voltage. The voltage detecting circuit is configured to detect the charge voltage of the corresponding one of the plurality of capacitors. The comparator compares the predetermined reference voltage with an output voltage from the voltage detecting circuit and is supplied with the direct-current source voltage from the direct-current power source. The voltage limiter is configured to limit a voltage applied to an external bypass switching circuit for bypassing the charge voltage under control in accordance with an output from the comparator, and is connected between the comparator and the external bypass switching circuit.

In one exemplary embodiment, a novel semiconductor apparatus includes a plurality of integrated circuits each of which includes a plurality of comparators and a plurality of voltage limiters. The plurality of voltage limiters are arranged with the plurality of comparators on a one-to-one basis. Each of the plurality of voltage limiters has a gate connected to an output terminal of a corresponding one of the plurality of comparators to form a parallel monitor circuit as one of a parallel monitor circuit group. Each of the plurality of voltage limiters is coupled in parallel to a bypass switching element that is coupled to an external capacitor which is one of a plurality of serially connected external capacitors coupled to the parallel monitor circuit which is in a state disconnected from a direct-current power source. The bypass switching circuit bypasses a charge voltage of the external capacitor when the charge voltage of the external capacitor exceeds a predetermined reference voltage.

In one exemplary embodiment, a novel method of capacitor charging includes the steps of generating, providing, arranging, applying, and bypassing. The generating step generates a direct-current source voltage. The providing step provides a plurality of capacitors serially connected one to another. The arranging step arranges a plurality of parallel monitor circuits connected in parallel to the plurality of capacitors on a one-to-one basis. The applying step applies the direct-current source voltage to the plurality of capacitors. The bypassing step bypasses charge currents of the plurality of capacitors when the charge voltage of the plurality of capacitors exceeds a respective predetermined reference voltage so that the plurality of capacitors is evenly charged.

In the above-mentioned method of capacitor charging, each of the plurality of parallel monitor circuits may include a reference voltage circuit, a voltage detecting circuit, a comparator, a bypass switching circuit and a voltage limiter. The reference voltage circuit is configured to generate the predetermined reference voltage. The voltage detecting circuit is configured to detect the charge voltage of the corresponding one of the plurality of capacitors. The comparator compares the predetermined reference voltage with an output voltage from the voltage detecting circuit, and is supplied with the direct-current source voltage from the direct-current power source. The bypass switching circuit is configured to bypass the charge voltage under control in accordance with an output from the comparator. The voltage limiter is connected between the comparator and the bypass switching circuit and is configured to limit a voltage applied to the bypass switching circuit.

In the above-mentioned method of capacitor charging, each of the plurality of capacitors may be an electric double-layer capacitor.

BRIEF DESCRIPTION OF THE DRAWINGS

A more complete appreciation of the disclosure and many of the attendant advantages thereof will be readily obtained by reference to the following detailed description when considered in connection with the accompanying drawings, wherein.

DETAILED DESCRIPTION OF THE INVENTION

Figure 1:
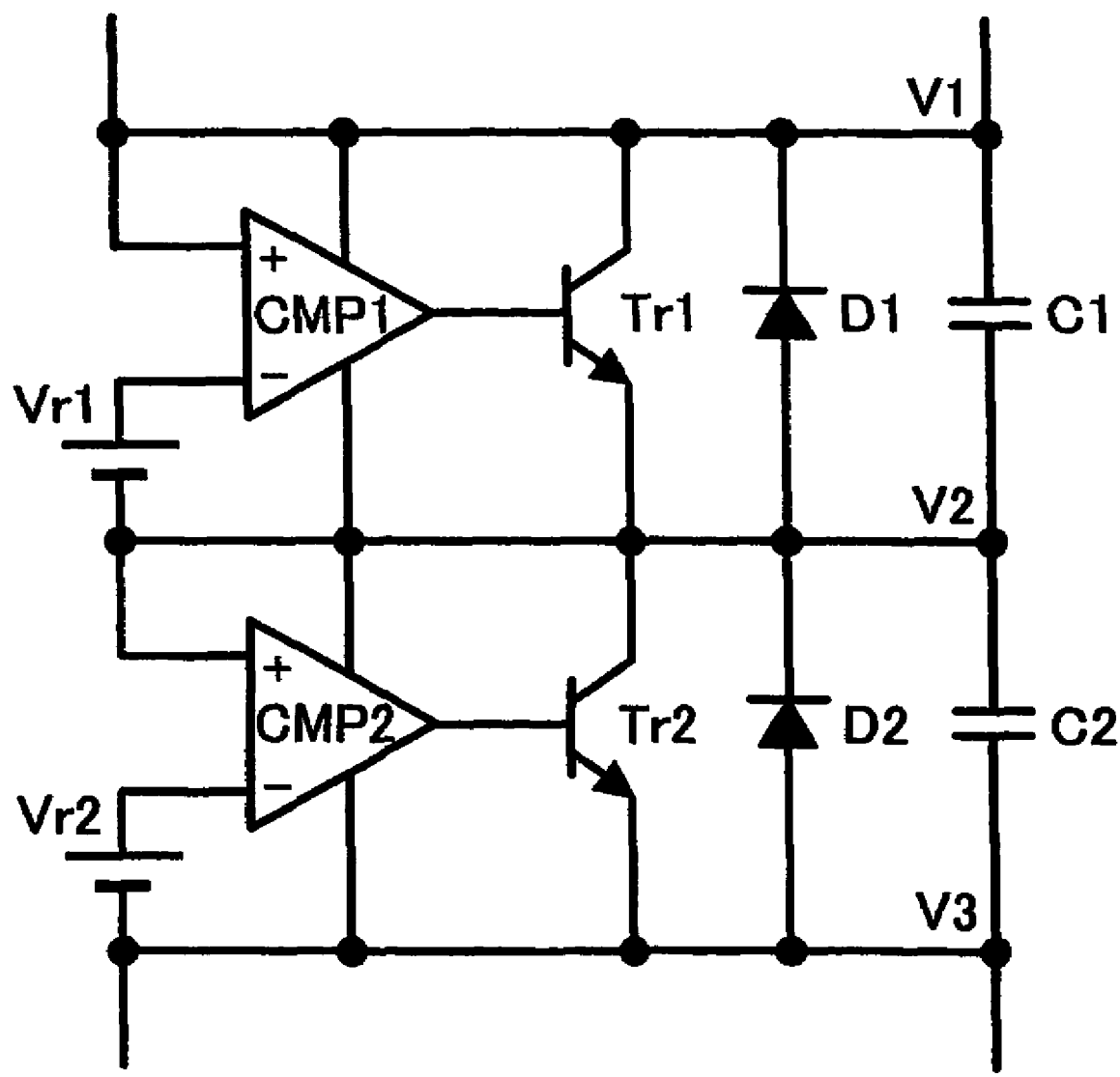
FIG. 1 is a schematic circuit diagram of a conventional parallel monitor circuit.

In describing exemplary embodiments illustrated in the drawings, specific terminology is employed for the sake of clarity. However, the disclosure of these embodiments are not intended to be limited to the specific terminology so selected and it is to be understood that each specific element includes all technical equivalents that operate in a similar manner.

In the drawings, like reference numerals designate identical or corresponding parts throughout the several views.

Figure 2:
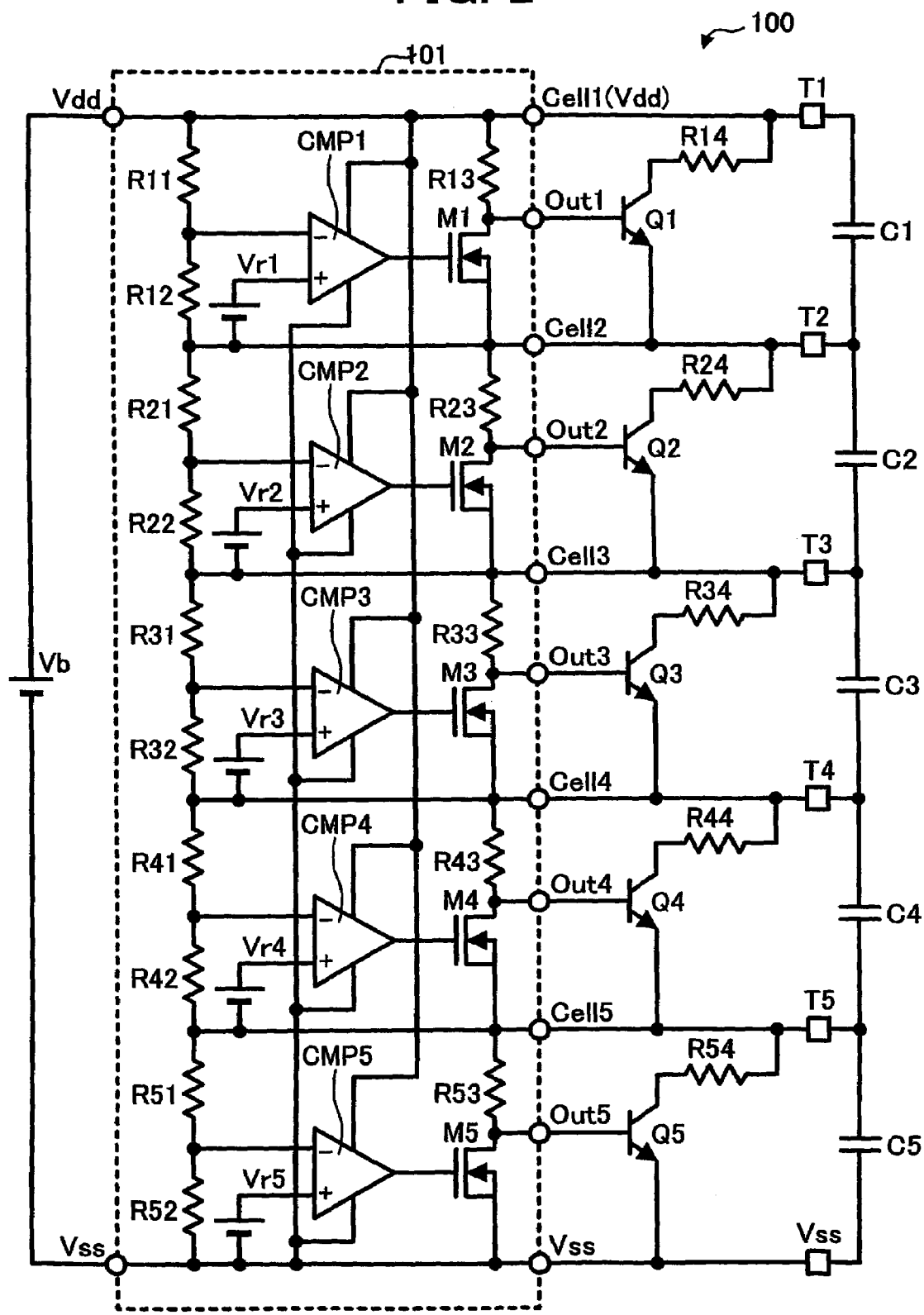
FIG. 2 is a schematic circuit diagram of a capacitor charging circuit according to a first embodiment of the present invention.

FIG. 2 illustrates a capacitor charging circuit 100 according to an exemplary embodiment of the present invention. In the charging circuit of FIG. 2, five stages of electric double-layer capacitors C1-C5 to be charged are arranged in series. Circuitry enclosed by a dotted square is an integrated circuit 101 in which five-stage parallel monitor circuits are formed corresponding to the electric double-layer capacitors C1-C5. Vb denotes a direct-current voltage source generating a source voltage to be used to charge the electric double-layer capacitors C1-C5 and also to be supplied to the integrated circuit 101. An output stage including transistors Q1-Q5 which are not integrated is connected between the integrated circuit 101 and the electric double-layer capacitors C1-C5. The circuit of FIG. 2 is an exemplary case in which an N-type semiconductor substrate is used, for example.

As illustrated in FIG. 2, the integrated circuit 101 has source power terminals Vdd and Vss, cell terminals Cell1-Cell5, and output terminals Out1-Out5. The source power terminals Vdd and Vss are connected to the direct-current voltage source Vb, and the cell terminals Cell1 and Cell2 are connected to the capacitor C1. Likewise, the cell terminals Cell2 and Cell3 are connected to the capacitor C2, the cell terminals Cell3 and Cell4 are connected to the capacitor C3, the cell terminals Cell4 and Cell5 are connected to the capacitor C4, and the cell terminal Cell5 and the source power terminal Vss are connected to the capacitor C5.

The capacitor C1 is connected in parallel to a serial circuit of the transistor Q1 and a resistor R14. In the same way, the capacitors C2-C5 are connected in parallel to serial circuits of the transistors Q2-Q5 and resistors R24-R54, respectively. The base of the transistor Q1 is connected to the output terminal Out1 of the integrated circuit 101. In the same way, the bases of the transistors Q2-Q5 are connected to the output terminals Out2-Out5, respectively.

Since the parallel monitor circuits of the integrated circuit 101 have a structure similar to each other, the following discussion focuses on one exemplary monitor circuit connected to the capacitor C1, which represents other parallel monitor circuits.

The voltage of the capacitor C1 is divided by resistors R11 and R12 which form a voltage detector and a voltage between the resistors R11 and R12 is input to a negative input terminal of a comparator CMP1. A positive input terminal of the comparator CMP1 is applied with a reference voltage Vr1 which is specifically adjusted to the comparator CMP1. An output of the comparator CMP1 is connected to a gate of an N-channel FET (field-effect transistor) M1 (hereinafter referred to as the FET M1). A source of the FET M1 is connected to the cell terminal Cell2 and a drain of the FET M1 is connected to the cell terminal Cell via a resistor R13. The comparator CMP1 is further connected to the source power terminals Vdd and Vss so as to be supplied with source energy from the direct-current voltage source Vb.

In this monitor circuit for the capacitor C1, the voltage of the capacitor C1 is relatively low during an early stage of charging and the voltage applied to the positive input terminal of the comparator CMP1 is comparatively high. As a consequence, the comparator CMP1 outputs a high level voltage nearly equal to the voltage at the source power terminal Vdd. This results in switching of the FET M1 into an ON state, so that the output terminal Out1 and the cell terminal Cell2 are short-circuited and accordingly a voltage between the output terminal Out1 and the cell terminal Cell2 becomes approximately 0. This consequently turns off the transistor Q1. Therefore, the transistor Q1 does not pass therethrough a current for bypassing a charge current of the capacitor C1.

In an advanced stage of the charging, the voltage of the capacitor C1 is increased and the output of the comparator CMP1 is reversed to a low level voltage nearly equal to the voltage at the source power terminal Vss when the voltage input to the inverse input terminal of the comparator CMP1 exceeds the reference voltage Vr1. As a result, the FET M1 turns off and consequently a base current is applied from the cell terminal Cell1 to the base of the transistor Q1 through the resistor R13 and the output terminal Out 1, so that the transistor Q1 is turned on. Accordingly, the charge current of the capacitor C1 is bypassed through the resistor R14 and the transistor Q1, which stops the charging of the capacitor C1. Accordingly, the voltage of the capacitor C1 is clamped to a voltage calculated by a formula Vr1 "x" (R11+R12)/R12.

In this way, the FET M1 and the resistor R13 which function as a voltage limiting circuit limit a range of voltage at the output terminal Out1 between the voltages of the cell terminals Cell1 and Cell2 even when the output voltage of the comparator CMP1 is changed by a full range of the direct-current source voltage (i.e., from the voltage Vss to the voltage Vdd). With this limitation, the output voltage from the output terminal Out1 may not be a voltage that damages the transistor Q1.

Figure 3:
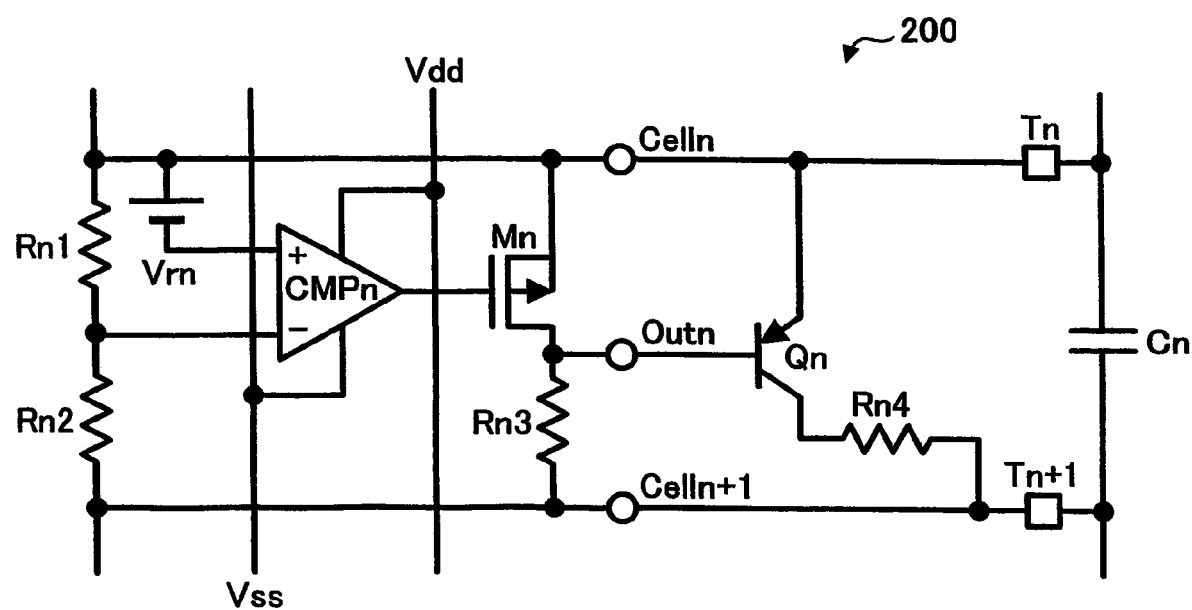
FIG. 3 is a schematic circuit diagram of a capacitor charging circuit according to a second embodiment of the present invention.

Referring to FIG. 3, a capacitor charging circuit 200 according to another embodiment of the present invention is now explained. The capacitor charging circuit 200 has a P-type semiconductor substrate and includes a plurality of monitor circuits in a manner similar to those of the capacitor charging circuit 100 shown in FIG. 2. However, FIG. 3 shows an exemplary one stage of the capacitor charging circuit 200. The capacitor charging circuit 200 of FIG. 3 is similar to the capacitor charging circuit 100 of FIG. 100, except for the following. In the capacitor charging circuit 200 of FIG. 3, a P-channel FET (field-effect transistor) Mn is applied as an active element of the voltage limiting circuit and has a source connected to a cell terminal Celln and a drain connected to the cell terminal Celln+1 via the resistor Rn3. In addition, a reference potential of the reference voltage Vrn is arranged to a side of the cell terminal Celln. Further, the bypass circuit is changed from an NPN transistor to a PNP transistor.

As an alternative to the FET Mn, the voltage limiting circuit may be formed with a CMOS (complementary metal oxide semiconductor) transistor, a plurality of FETs, or the like.

Figure 4:
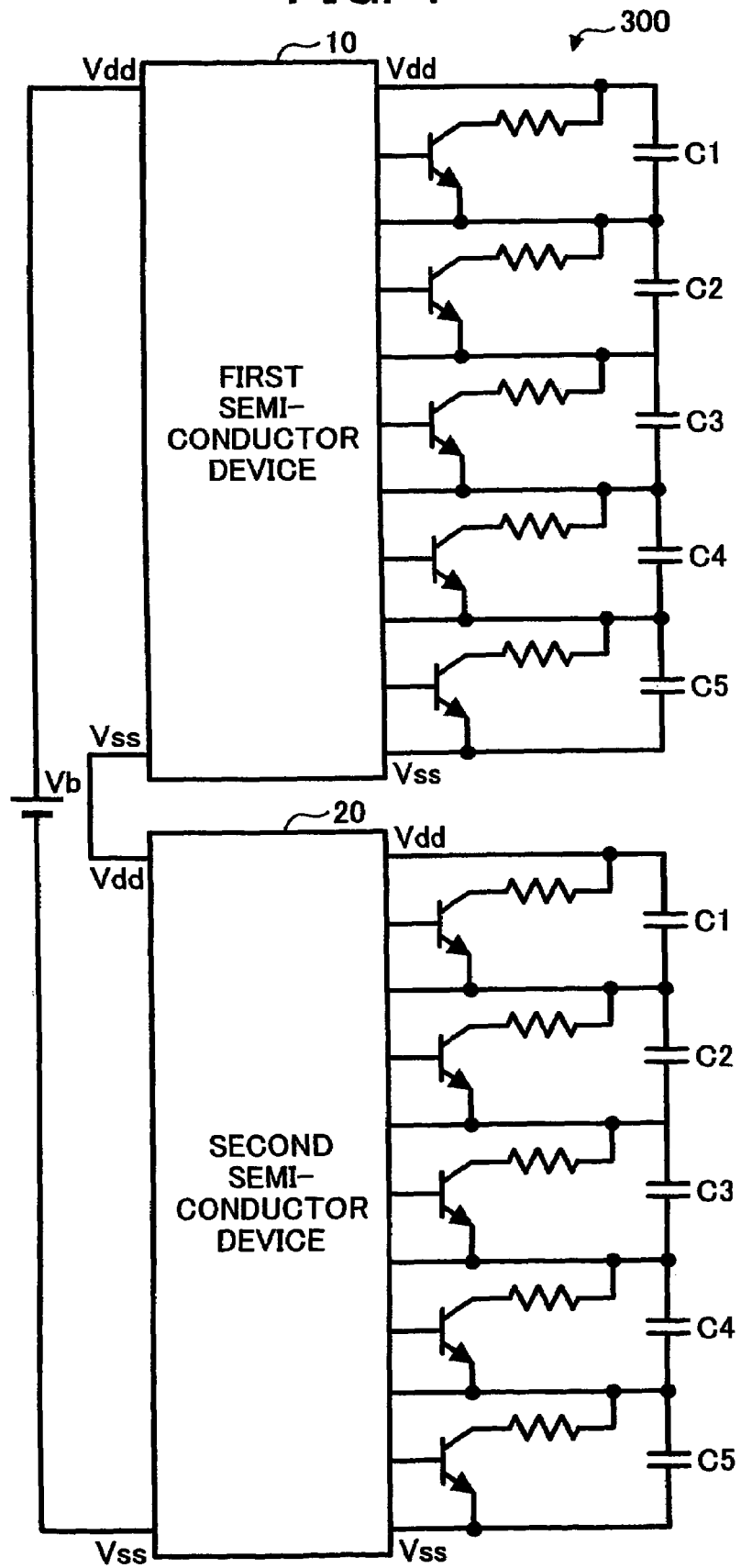
FIG. 4 is a schematic circuit diagram of a capacitor charging circuit according to a third embodiment of the present invention.

Referring to FIG. 4, a capacitor charging circuit 300 according to another embodiment of the present invention is now explained. The capacitor charging circuit 300 includes first and second integrated circuit 10 and 20 which are the integrated circuits 101 of FIG. 2. Integrated circuit 101 integrates monitor circuits for the five stages of the capacitors C1-C5, and two integrated circuits 101 can monitor ten capacitors. For example, if a voltage per a capacitor is 2.5 volts, ten capacitors can generate 25 volts.

As shown in FIG. 4, the direct-current voltage source Vb is connected to the source power terminal Vdd of the first integrated circuit 10 and the source power terminal Vss of the second integrated circuit 20, and the source power terminal Vss of the first integrated circuit 10 and the source power terminal Vdd of the second integrated circuit 20 are connected to each other. An equivalent to this structure may be obtained by implementing ten monitor circuits in the integrated circuit of FIG. 2 or 3.

Although the above-described embodiment uses two integrated circuits connected in series, as shown in FIG. 4, more than two integrated circuits can be connected in series in accordance with a number of capacitors required. For example, if a voltage per a capacitor is 2.5 volts, twenty capacitors can produce 50 volts. Also, although in this embodiment, the monitor circuits for five capacitors are integrated, it is possible to integrate the monitor circuits for any number of capacitors, such as ten capacitors, for example. In this case, if a voltage per a capacitor is 2.7 volts, ten capacitors can generate 27 volts.

In the descriptions of the above-described embodiments, the capacitor charging circuits are explained as including the direct-current voltage source Vb for charging the capacitors. However, it is possible to disconnect the voltage source from the integrated circuit and also to disconnect the integrated circuit from the output circuits and the capacitors. That is, in this case, the unit of the capacitors can be used as a power source. It is also possible to integrate the integrated circuit with the output circuit and the capacitors to use one integrated circuit as a power source.

Numerous additional modifications and variations are possible in light of the above teachings. It is therefore to be understood that within the scope of the appended claims, the disclosure of this patent specification may be practiced otherwise than as specifically described herein.

What is claimed as new and desired to be protected by Letters Patent of the United States is:

1. A capacitor charging circuit, comprising:
   a direct-current power source;
   a plurality of monitor circuits connected to a plurality of capacitors, each one of the plurality of monitor circuits applying a direct-current source voltage from the direct-current power source to a corresponding one of the plurality of capacitors and including a controllable bypassing circuit for bypassing a charge current of the corresponding one of the plurality of capacitors when the charge voltage of the corresponding one of the plurality of capacitors exceeds a predetermined reference voltage, each monitoring circuit further including a switchable voltage limiter for limiting voltage used to control the bypassing circuit.

2. The capacitor charging circuit of claim 1, wherein the plurality of capacitors are evenly charged.

3. The capacitor charging circuit of claim 1, wherein each monitor circuit comprises:
   a reference voltage circuit configured to generate the predetermined reference voltage;
   a voltage detecting circuit configured to detect the charge voltage of the corresponding one of the plurality of capacitors;
   a comparator for comparing the predetermined reference voltage with an output voltage from the voltage detecting circuit, the comparator being supplied with the direct-current source voltage from the direct-current power source;
   wherein the bypass circuit is a bypass switching circuit configured to bypass the charge voltage under control in accordance with an output from the comparator; and
   the switchable voltage limiter is connected between the comparator and the bypass switching circuit.

4. The capacitor charging circuit of claim 3, wherein the bypass switching circuit comprises a series connected transistor and resistor connected in parallel with a corresponding capacitor.

5. The capacitor charging circuit of claim 3, wherein the switchable voltage limiter comprises a series connected transistor and resistor connected in parallel with a corresponding capacitor, the transistor having a gate connected to the output of the comparator, a node between the transistor and resistor providing a control signal for the bypass switching circuit.

* * * * *